United States Patent
Basu et al.

(10) Patent No.: US 9,841,456 B2
(45) Date of Patent: Dec. 12, 2017

(54) ELECTRIC OUTAGE DETECTION AND LOCALIZATION

(71) Applicant: International Business Machines Corporation, Armonk, NY (US)

(72) Inventors: Chumki Basu, Bangalore (IN); Kaushik Das, Roskilde (DK); Ulrich A. Finkler, Mahopac, NY (US); Jagabondhu Hazra, Bangalore (IN); Ashok Pon Kumar, Bangalore (IN); Devasenapathi Periagraharam Seetharamakrishnan, Bangalore (IN); Amith Singhee, Yonkers, NY (US)

(73) Assignee: International Business Machines Corporation, Armonk, NY (US)

( * ) Notice: Subject to any disclaimer, the term of this patent is extended or adjusted under 35 U.S.C. 154(b) by 715 days.

(21) Appl. No.: 14/332,935

(22) Filed: Jul. 16, 2014

(65) Prior Publication Data
US 2016/0018458 A1 Jan. 21, 2016

(51) Int. Cl.
| | | |
|---|---|---|
| G01R 31/00 | (2006.01) | |
| G01R 15/00 | (2006.01) | |
| G01R 31/08 | (2006.01) | |
| G06Q 50/06 | (2012.01) | |
| G01R 21/133 | (2006.01) | |
| H02H 7/26 | (2006.01) | |

(52) U.S. Cl.
CPC ......... *G01R 31/088* (2013.01); *G01R 31/086* (2013.01); *G06Q 50/06* (2013.01); *G01R 21/133* (2013.01); *H02H 7/26* (2013.01); *Y04S 10/522* (2013.01)

(58) Field of Classification Search
CPC .. G01R 31/088; G01R 31/086; G01R 21/133; Y04S 10/522; G06Q 50/06; H02H 7/26
USPC ....................................................... 702/57–59
See application file for complete search history.

(56) References Cited

U.S. PATENT DOCUMENTS

| | | |
|---|---|---|
| 6,963,285 B2 | 11/2005 | Fischer et al. |
| 7,496,430 B2 | 2/2009 | Mak |
| 7,965,195 B2 | 6/2011 | Deaver, Sr. et al. |

(Continued)

OTHER PUBLICATIONS

Zhu, Jun, et al., "Automated Fault Location and Diagnosis on Electric Power Distribution Feeders", IEEE Transactions on Power Delivery, Apr. 1997, pp. 801-809, vol. 12, No. 2, IEEE Digital Library.

(Continued)

*Primary Examiner* — An Do
(74) *Attorney, Agent, or Firm* — Ference & Associates LLC

(57) ABSTRACT

Methods and arrangements for localizing an outage in a power grid. An outage is detected in a power grid, the power grid including interconnected nodes. At least one candidate network topology (in the power grid) with respect to the outage is determined, and power consumption information and measured voltages relative to the nodes in the power grid are received. Voltage at a plurality of nodes in the power grid is estimated based on the received power consumption information and on the at least one candidate network topology, and a location of the outage is estimated, based on the estimated node voltages and measured voltages. Other variants and embodiments are broadly contemplated herein.

20 Claims, 4 Drawing Sheets

(56) References Cited

U.S. PATENT DOCUMENTS

| 8,000,913 B2* | 8/2011 | Kreiss ................... G06Q 50/06 |
| | | 324/512 |
| 8,171,364 B2 | 5/2012 | Veillette |
| 2012/0146799 A1 | 6/2012 | Bell et al. |
| 2012/0324273 A1 | 12/2012 | Shaffer et al. |

OTHER PUBLICATIONS

El-Fouly, T.H.M., et al., "On the Compatibility of Fault Location Approaches and Distributed Generation", Integration of Wide-Scale Renewable Resources Into the Power Delivery System, 2009 CIGRE/IEEE PES Joint Symposium, Jul. 29-31, 2009, Calgary, AB, pp. 1-5, IEEE Digital Library.

* cited by examiner

ELECTRIC OUTAGE DETECTION AND LOCALIZATION

BACKGROUND

Electric power delivery networks, or "grids", can be vulnerable to outages for a great variety of reasons, and it is safe to assume that no network or grid is immune. In view of this inevitability, it is important for utility companies (or "utilities") to detect and pinpoint (or localize) the source of a power outage as quickly as possible. For instance, utilities may need to pay significant penalties for outages over an extended period of time, while outages can and do lead to significant revenue loss in any case.

Thus, it has long been recognized that quick and efficient outage detection and localization can remedy problems as just discussed, reducing restoration time, utility crew involvement and, by extension, overhead and maintenance costs. Over time, an increase in the utility's reliability can only enhance its public image in addition to avert significant monetary losses. However, to date, conventional arrangements for detecting and localizing outages have still yet to offer utilities and other entities a level of benefits and advantages considered to be desirable and within reach.

BRIEF SUMMARY

In summary, one aspect of the invention provides a method of localizing an outage in a power grid, said method comprising: utilizing at least one processor to execute computer code configured to perform the steps of: detecting an outage in a power grid, the power grid comprising interconnected nodes; determining at least one candidate network topology in the power grid with respect to the outage; receiving power consumption information and measured voltages relative to the nodes in the power grid; estimating voltage at a plurality of the nodes in the power grid based on the received power consumption information and on the at least one candidate network topology; and estimating a location of the outage based on the estimated node voltages and measured voltages.

Another aspect of the invention provides an apparatus for localizing an outage in a power grid, said apparatus comprising: at least one processor; and a computer readable storage medium having computer readable program code embodied therewith and executable by the at least one processor, the computer readable program code comprising: computer readable program code configured to detect an outage in a power grid, the power grid comprising interconnected nodes; computer readable program code configured to determine at least one candidate network topology in the power grid with respect to the outage; computer readable program code configured to receive power consumption information and measured voltages relative to the nodes in the power grid; computer readable program code configured to estimate voltage at a plurality of the nodes in the power grid based on the received power consumption information and on the at least one candidate network topology; and computer readable program code configured to estimate a location of the outage based on the estimated node voltages and measured voltages.

An additional aspect of the invention provides a computer program product for localizing an outage in a power grid, said computer program product comprising: a computer readable storage medium having computer readable program code embodied therewith, the computer readable program code comprising: computer readable program code configured to detect an outage in a power grid, the power grid comprising interconnected nodes; computer readable program code configured to determine at least one candidate network topology in the power grid with respect to the outage; computer readable program code configured to receive power consumption information and measured voltages relative to the nodes in the power grid; computer readable program code configured to estimate voltage at a plurality of the nodes in the power grid based on the received power consumption information and on the at least one candidate network topology; and computer readable program code configured to estimate a location of the outage based on the estimated node voltages and measured voltages.

A further aspect of the invention provides a method comprising: detecting an outage in a power grid, the power grid comprising interconnected nodes; determining a plurality of candidate network topologies with respect to the outage; receiving power consumption information relative to the nodes in the power grid; said receiving comprising determining missing smart meter data with respect to at least one node in the power grid; estimating voltage at a plurality of the nodes in the power grid based on the received power consumption information and the plurality of candidate network topologies; and determining a location of the outage based on the estimated node voltages and via finding an active topology, from among the candidate network topologies, which presents a minimum cumulative difference between estimated and measured voltages.

For a better understanding of exemplary embodiments of the invention, together with other and further features and advantages thereof, reference is made to the following description, taken in conjunction with the accompanying drawings, and the scope of the claimed embodiments of the invention will be pointed out in the appended claims.

DETAILED DESCRIPTION

Figure 1:
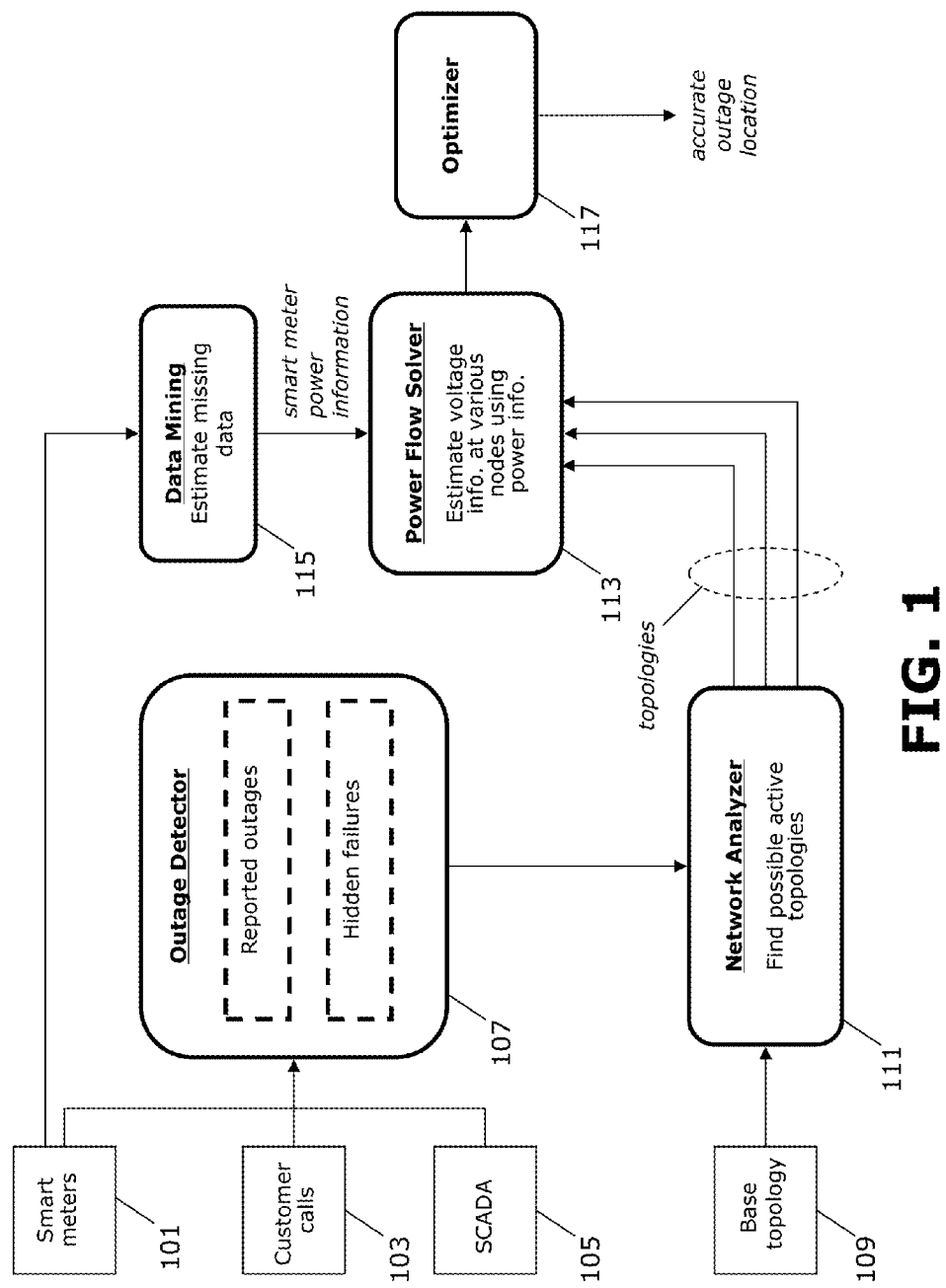
FIG. 1 schematically illustrates a system architecture.

It will be readily understood that the components of the embodiments of the invention, as generally described and illustrated in the figures herein, may be arranged and designed in a wide variety of different configurations in addition to the described exemplary embodiments. Thus, the following more detailed description of the embodiments of the invention, as represented in the figures, is not intended to limit the scope of the embodiments of the invention, as claimed, but is merely representative of exemplary embodiments of the invention.

Reference throughout this specification to "one embodiment" or "an embodiment" (or the like) means that a particular feature, structure, or characteristic described in connection with the embodiment is included in at least one embodiment of the invention. Thus, appearances of the phrases "in one embodiment" or "in an embodiment" or the like in various places throughout this specification are not necessarily all referring to the same embodiment.

Furthermore, the described features, structures, or characteristics may be combined in any suitable manner in at least one embodiment. In the following description, numerous specific details are provided to give a thorough understanding of embodiments of the invention. One skilled in the relevant art may well recognize, however, that embodiments of the invention can be practiced without at least one of the specific details thereof, or can be practiced with other methods, components, materials, et cetera. In other instances, well-known structures, materials, or operations are not shown or described in detail to avoid obscuring aspects of the invention.

The description now turns to the figures. The illustrated embodiments of the invention will be best understood by reference to the figures. The following description is intended only by way of example and simply illustrates certain selected exemplary embodiments of the invention as claimed herein.

Specific reference will now be made here below to FIGS. 1 and 2. It should be appreciated that the processes, arrangements and products broadly illustrated therein can be carried out on, or in accordance with, essentially any suitable computer system or set of computer systems, which may, by way of an illustrative and non-restrictive example, include a system or server such as that indicated at 12' in FIG. 4. In accordance with an exemplary embodiment, most if not all of the process steps, components and outputs discussed with respect to FIGS. 1 and 2 can be performed or utilized by way of a processing unit or units and system memory such as those indicated, respectively, at 16' and 28' in FIG. 4, whether on a server computer, a client computer, a node computer in a distributed network, or any combination thereof.

Broadly contemplated herein, in accordance with at least one embodiment of the invention, are methods and arrangements for inferring and localizing any outage in a power grid by analyzing smart meter data and SCADA data. Smart meters, as generally understood herein, involve electronic devices which record energy consumption over predetermined intervals and can communicate such information back to a utility. SCADA (supervisory control and data acquisition) systems operate with coded signals over communication channels to provide control of remote equipment (e.g., equipment associated with substations) and may be combined with a data acquisition system by adding the use of coded signals over communication channels to acquire information about the status of the remote equipment.

Generally, it is recognized that smart meters do not send data in the event of a power outage or communication failure (e.g., which may arise from congestion in a communication network). On the other hand, SCADA data tend to provide information solely at a substation level, which makes it difficult to localize an outage. As such, in accordance with at least one embodiment of the invention, there are broadly contemplated herein arrangements for using smart meter data (voltage and power consumption), "last gasp" messages from smart meters, and substation-level SCADA data, to accurately pinpoint the outage location and determine which link or links in the power grid ended up failing.

In accordance with at least one embodiment of the invention, as broadly contemplated herein, it can be appreciated that SCADA and smart meter data can be of great assistance in detecting and localizing outages. For instance, SCADA data can help in identifying an exact internal link that may have failed in a grid, without the need for manual searching or scouting. Smart meter data can also be very helpful in identifying a precise end link that may have failed; particularly, voltage and power consumption information as derived from smart meters may be helpful in avoiding ambiguities in fault localization that may otherwise arise from a lack of transmitted messages.

In accordance with at least one embodiment of the invention, voltage and power consumption information from smart meters and SCADA, as well as last gasp or missing messages from smart meters, are employed to accurately identify the location of an outage. In a first step, there is derived a list of prospective network topologies via using last gasp or missing data from smart meters and from customer calls; these prospective topologies would indeed include an indication of prospective locations or links where an outage may have taken place. An assumption can then be made that all nodes in the system follow Kirchoff's Current Law (or analogous laws for other types of networks and their flows) to identify which nodes violate the laws. An accurate outage location is converged upon by minimizing the violation and thus identifying failure in a precise node, from the prospective topologies; this involves using voltage information and power consumption information from the smart meters and the SCADA data.

FIG. 1 schematically illustrates a system architecture in accordance with at least one embodiment of the invention. As shown, smart meters 101, customer calls 103 and SCADA data 105 provide input to an outage detector 107. Thus, outage detector 107 assimilates and accumulates such data to establish, among other things, reported outages and the fact of the presence of one or more hidden failures. This established information can then be fed to a network analyzer 109 that, on the basis of a base topology 111 of the network, can send a set of prospective (active) network topologies to a power flow solver 113.

In accordance with at least one embodiment of the invention, via data mining 115, last gasp and/or missing messages can also be determined from smart meters 101 to thereby estimate missing data. Such missing data, along with smart meter power information already obtained, can be sent in total to power flow solver 113. Power flow solver 113 incorporates the prospective network topologies and smart meter power information to estimate voltage information at various nodes in the grid. Based on such voltage information, an optimizer 117 thereafter provides information on the location of an outage. Further details regarding the mechanics of this and other determinations will be better understood and appreciated from the discussion which follows.

In accordance with at least one embodiment of the invention, outage detector 107 serves to determine whether a link failure exists, or not. To this end, it determines the existence of reported outages and unreported (or hidden) failures, alike. Information on reported outages can be determined from last gasps (from smart meters 101 and from customer calls 103, while unreported/hidden failures can be derived from data from smart meters 101 and SCADA 105. For instance, hidden failures may have an impact where a subset of links and/or loads, if disconnected from the grid, may increase or decrease the current drawn, which then causes a change in one or more smart meter voltage readings.

In accordance with at least one embodiment of the invention, network analyzer 111 can operate differently in the event of reported or unreported failures. In the case of reported failures, analyzer 111 uses missing data or last-gasp data to develop an approximation of an outage location, and then generates the prospective topologies (mentioned above) that may have resulted in the outage pattern at hand. For unreported failures, analyzer 111 uses SCADA and smart meter data to determine possible failure locations and thereupon develop the prospective topologies.

In accordance with at least one embodiment of the invention, data mining 115 is invoked in the case of smart meters 101 which haven't reported any consumption data or last gasp messages in the event of an outage. Thus, for such meters, data mining is undertaken with a suitable algorithm that fills in missing data based on historical consumption patterns.

In accordance with at least one embodiment of the invention, power flow solver 113 solves network equations based on smart meter measurements and on one or more input (prospective) network topologies. It calculates voltages at each node, and any suitable manner can be employed therefore, e.g., Fast Decouple Load Flow, Newton Raphson Load Flow, Gauss-Seidel method, etc. could be used to solve power flow equations.

In accordance with at least one embodiment of the invention, optimizer 117 acts to minimize a cumulative sum of measured and estimated voltage with respect to nodes (e.g., households or other points or nodes drawing from the grid) present in the prospective active topologies (as determined by network analyzer 111) and determines a most likely or suitable topology for the outage condition at hand. Attendant equations can be expressed as such:

$$\text{Min} \sum_{i=1}^{SM} (V_i^{Measured} - V_i^{Calculated})$$

$$\text{s.t.} \sum_{k=1}^{nbus} E_k^{mismatch} = \sum_{j=1}^{nfeeder} (E_j^{Measured} - E_j^{Calculated})$$

Figure 2:
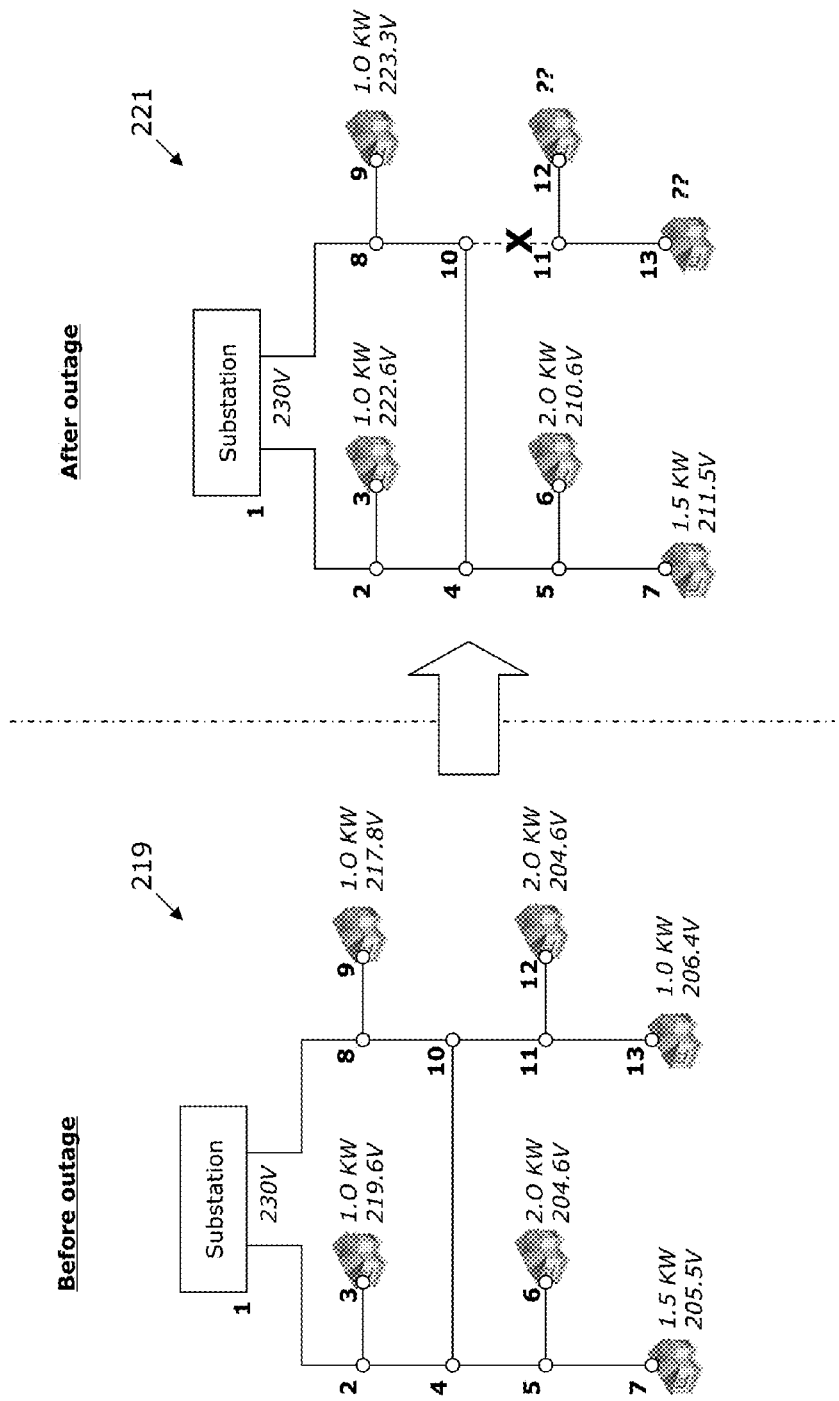
FIG. 2 schematically illustrates a working example of outage detection and localization.

FIG. 2 schematically illustrates a working example of outage detection and localization, in accordance with at least one embodiment of the invention, with respect to a grid before (219) and after (221) an outage. (Reference can continue to be made to FIG. 1 and the components illustrated therein.) Shown in each grid are a substation, and several junctions (in the grid) and residences; these components are numbered 1-13. Each residence (3, 6, 7, 9, 12, 13) is assumed to have a smart meter; at each, there is shown here a measured power consumption and measured voltage. (The measured power consumption can be with respect to a predetermined time period, e.g., the last hour or several hours.)

In accordance with at least one embodiment of the invention, in the working example illustrated, smart meter 13 reports a last gasp while smart meter 12 fails to send any meter data (without reporting a last gasp). Outage detector 107 determines generally that an outage has taken place. If, in the present example, it can be assumed that there were no incoming customer calls 103, then detection of a sudden increase in voltage at smart meters by 3-6 volts can point to a sudden change in the network.

In accordance with at least one embodiment of the invention, in the working example illustrated, network analyzer 111 (see FIG. 1) verifies missing smart meter data from 12 and 13, and generates a set of possible link failures which may have led to a power cut at nodes 12 and 13. It can thus be appreciated that, for this scenario, the prospective network topologies will show one the possibility of failed or severed links as follows: 10-11, 11-13, 11-12, (11-12 & 11-13), (4-10 & 10-11), or (4-10 & 8-10).

In accordance with at least one embodiment of the invention, in the working example illustrated, since smart meter 12 failed to send any meter data at all, data mining 115 can estimate the load for that node (residence) using historical time series data (e.g., can determine that an estimated load at 12 is 2 KW). Imputing the missing values here can be undertaken via essentially any suitable process. This may involve constructing a matrix where rows represent variables (e.g., energy consumption at different times for a meter, weather parameters at different times, monthly energy consumption for a meter in the present and previous year, day of the week, whether or not a day is a holiday, rated wattage, type of customer [residential or commercial]) and columns represent individual meters. With a matrix so constructed, methodologies such as row mean, k-NN, SVD can be applied, as can a hybrid methodology involving two more of those.

In accordance with at least one embodiment of the invention, in the working example illustrated, power flow solver 113 acts to estimate node voltage as follows (for each prospective active topology):

$$V_i^e = \frac{1}{Y_{ij}} \left[ \frac{P_i - jQ_i}{V_i^{e*}} - Y_{i1} V_1^e - Y_{i2} V_2^e - \ldots - Y_{in} V_n^e \right],$$

where $V_i^e$ is the estimated voltage at node i,
$Y_{ij}$ is the admittance of a link between nodes i and j,
$P_i$ is active power consumption at node i, and
$Q_i$ is reactive power consumption at node i.

Here, $P_i$ and $Q_i$ can be obtained from smart meter readings. In the event of no link between a node i and a node j, $Y_{ij}=0$. Calculation of $V_i^e$ is an iterative process, and can continue until the change in this value between two consecutive iterations decays to a predetermined threshold (e.g., $10^{-3}$).

In accordance with at least one embodiment of the invention, in the working example illustrated, optimizer 117 acts to find the prospective active topology which presents the minimum cumulative difference between estimated and measured voltages. Thus, the following operation can be performed:

$$\text{Find } S_i \in (S_1 \ldots S_n) \text{ s.t.} \sum_{j=1}^{SM} [V_j^m - V_{ij}^e] \text{ gets minimized}$$

where S is a set of links out of service,
SM is a set of smart meters in operation,
$V_j^m$ is a smart meter voltage at node j, and
$V_{ij}^e$ is an estimated voltage at node j for outage set $S_i$.
Accordingly, it can be determined here that an outage is present in the link 10-11, as the summation quantity noted above will end up being less than for other candidate links.

In accordance with at least one embodiment of the invention, it may arise that, in certain situations, different combination of outages at multiple locations may have resulted in similar voltage drops across nodes, leading to non-unique outage solutions. Here, prior information or information on "sparseness" may be used to choose one solution among a set of possible solutions to locate the outage accurately. "Sparseness" here refers to finding a solution with the least number of outage locations that is largely consistent with the voltage boosts. "Prior information" can include information on locations that have a historically high outage probability, along information about a typical magnitude and duration of outages.

Generally, the discussion herein has largely focused on addressing challenges related to power grids, and particularly to the detection and localization of failures or outages therein. However, it should be understood and appreciated that, in accordance with at least one embodiment of the invention, concepts as broadly contemplated herein may be applied to other settings and contexts. Thus, for instance, methods and arrangements as broadly contemplated herein can be applied to areas or disciplines that address the leaking or pilferage of liquids (e.g., water or oil) in a pipeline-based distribution network.

Figure 3:
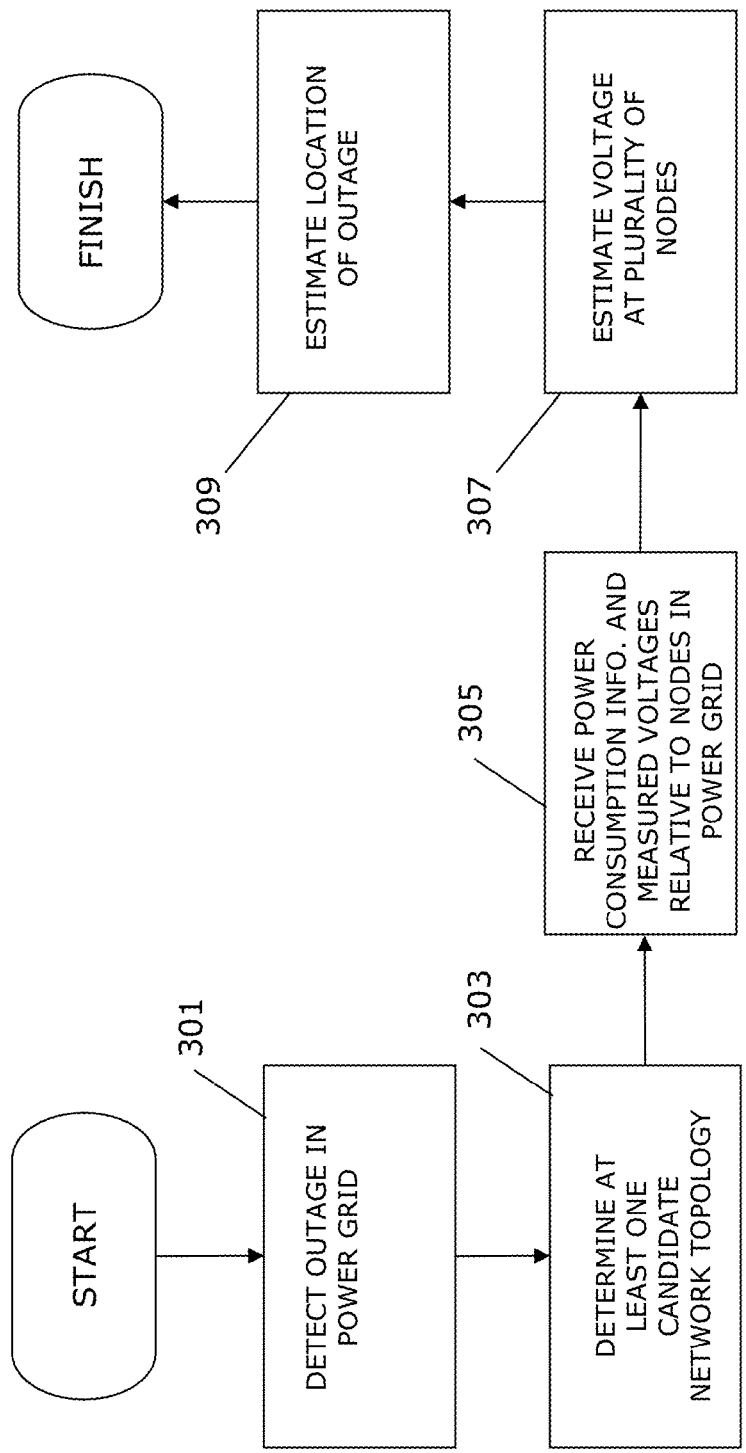
FIG. 3 sets forth a process more generally for localizing an outage in a power grid.

FIG. 3 sets forth a process more generally for localizing an outage in a power grid, in accordance with at least one embodiment of the invention. It should be appreciated that a process such as that broadly illustrated in FIG. 3 can be carried out on essentially any suitable computer system or set of computer systems, which may, by way of an illustrative and non-restrictive example, include a system such as that indicated at 12' in FIG. 4 In accordance with an example embodiment, most if not all of the process steps discussed with respect to FIG. 3 can be performed by way of a processing unit or units and system memory such as those indicated, respectively, at 16' and 28' in FIG. 4.

As shown in FIG. 3, in accordance with at least one embodiment of the invention, an outage is detected in a power grid, the power grid comprising interconnected nodes (301). At least one candidate network topology (in the power grid) with respect to the outage is determined (303), and power consumption information and measured voltages relative to the nodes in the power grid are received (305). Voltage at a plurality of the nodes in the power grid is estimated based on the received power consumption information and on the at least one candidate network topology (307), and a location of the outage is estimated, based on the estimated node voltages and measured voltages (309).

Figure 4:
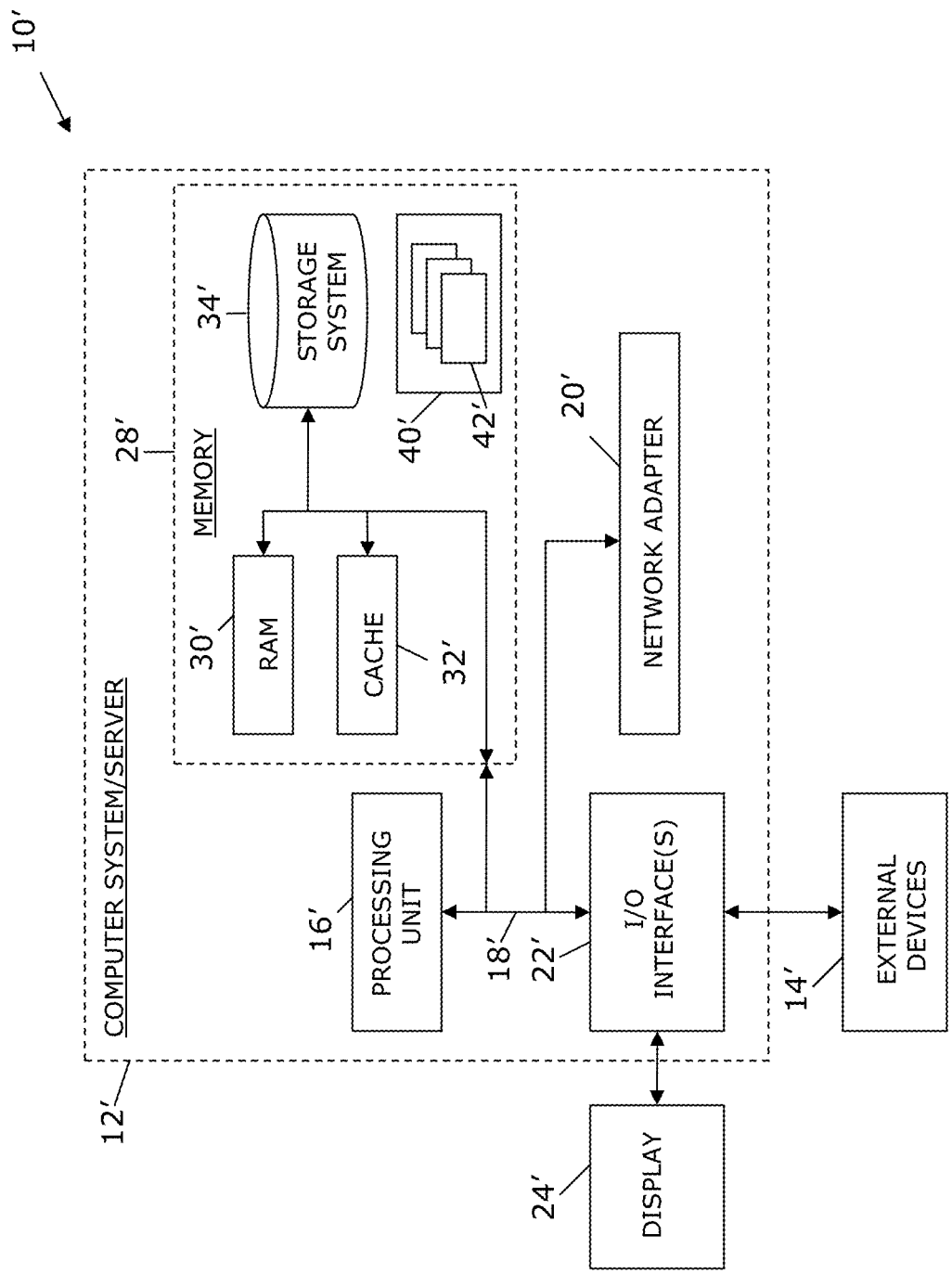
FIG. 4 illustrates a computer system.

Referring now to FIG. 4, a schematic of an example of a cloud computing node is shown. Cloud computing node 10' is only one example of a suitable cloud computing node and is not intended to suggest any limitation as to the scope of use or functionality of embodiments of the invention described herein. Regardless, cloud computing node 10' is capable of being implemented and/or performing any of the functionality set forth hereinabove. In accordance with embodiments of the invention, computing node 10' may not necessarily even be part of a cloud network but instead could be part of another type of distributed or other network, or could represent a stand-alone node. For the purposes of discussion and illustration, however, node 10' is variously referred to herein as a "cloud computing node".

In cloud computing node 10' there is a computer system/server 12', which is operational with numerous other general purpose or special purpose computing system environments or configurations. Examples of well-known computing systems, environments, and/or configurations that may be suitable for use with computer system/server 12' include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12' may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12' may be practiced in distributed cloud computing environments where tasks are performed by remote processing devices that are linked through a communications network. In a distributed cloud computing environment, program modules may be located in both local and remote computer system storage media including memory storage devices.

As shown in FIG. 4, computer system/server 12' in cloud computing node 10 is shown in the form of a general-purpose computing device. The components of computer system/server 12' may include, but are not limited to, at least one processor or processing unit 16', a system memory 28', and a bus 18' that couples various system components including system memory 28' to processor 16'.

Bus 18' represents at least one of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12' typically includes a variety of computer system readable media. Such media may be any available media that are accessible by computer system/server 12', and include both volatile and non-volatile media, removable and non-removable media.

System memory 28' can include computer system readable media in the form of volatile memory, such as random access memory (RAM) 30' and/or cache memory 32'. Computer system/server 12' may further include other removable/non-removable, volatile/non-volatile computer system storage media. By way of example only, storage system 34' can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18' by at least one data media interface. As will be further depicted and described below, memory 28' may include at least one program product having a set (e.g., at least one) of program modules that are configured to carry out the functions of embodiments of the invention.

Program/utility 40', having a set (at least one) of program modules 42', may be stored in memory 28' (by way of example, and not limitation), as well as an operating system, at least one application program, other program modules, and program data. Each of the operating systems, at least one application program, other program modules, and program data or some combination thereof, may include an implementation of a networking environment. Program modules 42' generally carry out the functions and/or methodologies of embodiments of the invention as described herein.

Computer system/server 12' may also communicate with at least one external device 14' such as a keyboard, a pointing device, a display 24', etc.; at least one device that enables a user to interact with computer system/server 12';

and/or any devices (e.g., network card, modem, etc.) that enable computer system/server 12' to communicate with at least one other computing device. Such communication can occur via I/O interfaces 22'. Still yet, computer system/server 12' can communicate with at least one network such as a local area network (LAN), a general wide area network (WAN), and/or a public network (e.g., the Internet) via network adapter 20'. As depicted, network adapter 20' communicates with the other components of computer system/server 12' via bus 18'. It should be understood that although not shown, other hardware and/or software components could be used in conjunction with computer system/server 12'. Examples include, but are not limited to: microcode, device drivers, redundant processing units, external disk drive arrays, RAID systems, tape drives, and data archival storage systems, etc.

This disclosure has been presented for purposes of illustration and description but is not intended to be exhaustive or limiting. Many modifications and variations will be apparent to those of ordinary skill in the art. The embodiments were chosen and described in order to explain principles and practical application, and to enable others of ordinary skill in the art to understand the disclosure.

Although illustrative embodiments of the invention have been described herein with reference to the accompanying drawings, it is to be understood that the embodiments of the invention are not limited to those precise embodiments, and that various other changes and modifications may be affected therein by one skilled in the art without departing from the scope or spirit of the disclosure.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method of localizing an outage in a power grid, said method comprising:
    utilizing at least one processor to execute computer code configured to perform the steps of:
    detecting an outage in a power grid, the power grid comprising interconnected nodes;
    determining at least one candidate network topology in the power grid with respect to the outage using at least one of last gasp smart meter data and customer call data;
    receiving power consumption information and measured voltages relative to the nodes in the power grid;
    estimating voltage at a plurality of the nodes in the power grid based on the received power consumption information and on the at least one candidate network topology;
    estimating a location of the outage based on the estimated node voltages and measured voltages;
    determining, based upon the estimated location of the outage and the estimated node voltages and measured voltages, at least one link in the power grid that has failed; and
    providing a notification to a user regarding the determined failed at least one link and estimated location of the outage.

2. The method according to claim 1, wherein:
    the at least one candidate network topology comprises a plurality of candidate network topologies; and
    said estimating of a location comprises estimating an active network topology in the power grid from among the candidate network topologies.

3. The method according to claim 1, wherein said detecting comprises detecting based on smart meter data.

4. The method according to claim 3, wherein said detecting of an outage comprises detecting additionally on a basis of at least one of: at least one customer phone call and supervisory control and data acquisition (SCADA) data.

5. The method according to claim 1, wherein said receiving comprises determining missing data with respect to at least one node in the power grid.

6. The method according to claim 5, wherein the missing data comprise missing smart meter data.

7. The method according to claim 6, wherein the missing data comprise at least one of: a missing smart meter reading and a missing smart meter last-gasp message.

8. The method according to claim 1, wherein said estimating of a location comprises performing an optimization with respect to the at least one candidate network topology.

9. The method according to claim 8, wherein said performing of an optimization comprises finding an active network topology in the power grid which presents a minimum cumulative difference between estimated and measured voltages.

10. An apparatus for localizing an outage in a power grid, said apparatus comprising:
    at least one processor; and
    a computer readable storage medium having computer readable program code embodied therewith and executable by the at least one processor, the computer readable program code comprising:
    computer readable program code configured to detect an outage in a power grid, the power grid comprising interconnected nodes;
    computer readable program code configured to determine at least one candidate network topology in the power grid with respect to the outage using at least one of last gasp smart meter data and customer call data;
    computer readable program code configured to receive power consumption information and measured voltages relative to the nodes in the power grid;
    computer readable program code configured to estimate voltage at a plurality of the nodes in the power grid based on the received power consumption information and on the at least one candidate network topology;
    computer readable program code configured to estimate a location of the outage based on the estimated node voltages and measured voltages;
    computer readable program code configured to determine, based upon the estimated location of the outage and the estimated node voltages and measured voltages, at least one link in the Dower grid that has failed; and
    computer readable program code configured to provide a notification to a user regarding the determined failed at least one link and estimated location of the outage.

11. A computer program product for localizing an outage in a power grid, said computer program product comprising:
    a computer readable storage medium having computer readable program code embodied therewith, the computer readable program code comprising:
    computer readable program code configured to detect an outage in a power grid, the power grid comprising interconnected nodes;
    computer readable program code configured to determine at least one candidate network topology in the power grid with respect to the outage using at least one of last gasp smart meter data and customer call data;
    computer readable program code configured to receive power consumption information and measured voltages relative to the nodes in the power grid;
    computer readable program code configured to estimate voltage at a plurality of the nodes in the power grid based on the received power consumption information and on the at least one candidate network topology;
    computer readable program code configured to estimate a location of the outage based on the estimated node voltages and measured voltages;
    computer readable program code configured to determine, based upon the estimated location of the outage and the estimated node voltages and measured voltages, at least one link in the power grid that has failed; and computer readable program code configured to provide a notification to a user regarding the determined failed at least one link and estimated location of the outage.

12. The computer program product according to claim 11, wherein:

the at least one candidate network topology comprises a plurality of candidate network topologies; and said computer readable program code is configured to estimate an active network topology in the power grid from among the candidate network topologies.

13. The computer program product according to claim 11, wherein said computer readable program code is configured to detect an outage based on smart meter data.

14. The computer program product according to claim 13, wherein said computer readable program code is configured to detect an outage additionally on a basis of at least one of: at least one customer phone call and supervisory control and data acquisition (SCADA) data.

15. The computer program product according to claim 11, wherein said computer readable program code is configured to determine missing data with respect to at least one node in the power grid.

16. The computer program product according to claim 15, wherein the missing data comprise missing smart meter data.

17. The computer program product according to claim 16, wherein the missing data comprise at least one of: a missing smart meter reading and a missing smart meter last-gasp message.

18. The computer program product according to claim 11, wherein said computer readable program code is configured to estimate a location via performing an optimization with respect to the at least one candidate network topology.

19. The computer program product according to claim 18, wherein performing of an optimization comprises finding an active topology which presents a minimum cumulative difference between estimated and measured voltages.

20. A method of localizing an outage in a power grid, said method comprising:

utilizing at least one processor to execute computer code configured to perform the steps of:

detecting an outage in a power grid, the power grid comprising interconnected nodes;

determining a plurality of candidate network topologies with respect to the outage using at least one of last gasp smart meter data and customer call data;

receiving power consumption information relative to the nodes in the power grid;

said receiving comprising determining missing smart meter data with respect to at least one node in the power grid;

estimating voltage at a plurality of the nodes in the power grid based on the received power consumption information and the plurality of candidate network topologies; and determining a location of the outage based on the estimated node voltages and via finding an active topology, from among the candidate network topologies, which presents a minimum cumulative difference between estimated and measured voltages;

determining, based upon the estimated location of the outage and the estimated node voltages and measured voltages, at least one link in the power grid that has failed; and providing a notification to a user regarding the determined failed at least one link and estimated location of the outage.

\* \* \* \* \*